United States Patent [19]
Yano et al.

[11] 3,949,326
[45] Apr. 6, 1976

[54] ELECTROMECHANICAL FILTER

[75] Inventors: Takeshi Yano; Takehiro Futami; Seiichiro Kanazawa; Tetsuo Hayashi, all of Tokyo, Japan

[73] Assignee: Nippon Electric Company Limited, Tokyo, Japan

[22] Filed: Feb. 27, 1975

[21] Appl. No.: 553,711

[30] Foreign Application Priority Data
Feb. 28, 1974  Japan.............................. 49-24538

[52] U.S. Cl. ...................... 333/71; 333/72; 333/74
[51] Int. Cl.²... H03H 9/04; H03H 9/26; H03H 9/32
[58] Field of Search...... 333/71, 72, 74, 30 R, 31 R; 310/8.1, 8.2, 8.3, 8.4, 8.5, 8.6

[56]  References Cited
UNITED STATES PATENTS

| | | | |
|---|---|---|---|
| 3,439,295 | 4/1969 | Bise...................................... | 333/71 |
| 3,725,828 | 4/1973 | Temes.................................. | 333/71 |

Primary Examiner—Alfred E. Smith
Assistant Examiner—Marvin Nussbaum
Attorney, Agent, or Firm—Sughrue, Rothwell, Mion Zinn & Macpeak

[57]  ABSTRACT

Electromechanical filters of the type having a plurality of resonators coupled to each other by couplers which make it possible to provide a transmission frequency characteristic with finite-attenuation poles are disclosed. The filters have a first resonator disposed on the input side and a second resonator disposed on the output side of the filter. A plurality of third resonators, at least two in number, are disposed between the first and second resonators. The third resonators are coupled mechanically in parallel to the first and second resonators by a plurality of couplers so that one of the first and second resonators is in reverse phase relationship with one of the third resonators. Also, the coupling coefficients between the couplers differ from each other.

7 Claims, 10 Drawing Figures

ELECTROMECHANICAL FILTER

BACKGROUND OF THE INVENTION

1. Field of the Invention:

The present invention relates to electromechanical filters of the type having a plurality of resonators coupled to each other by couplers to make it readily possible to provide a transmission frequency characteristic with finite-attenuation poles. The invention relates more particularly to an electromechanical filter in which the coupling coefficients given by the couplers differ from each other.

2. Description of the Prior Art:

Electromechanical filters of the type having a plurality of resonators coupled to each other in a chain by couplers have been widely used, for example, in carrier telephone transmission systems. In this application, an electromechanical filter having mechanical attenuation poles is desirable to provide a steep transmission frequency characteristic. One prior art electromechanical filter is disclosed in "A Twin Tee Multimode Mechanical Filter" published in *Proceedings of The IEEE*, Vol. 54, pp. 1961–1962, of December 1966. This electromechanical filter is such that a symmetrical lattice circuit is transformed into a symmetrical parallel tee ladder circuit, which is then constituted of dual-mode resonators. This type of electromechanical filter is advantageous in that the number of resonators used can be half that required for the ordinary type which uses single-mode resonators, because the former employs dual-mode resonators. However, because of the dual-mode structure, this type of electromechanical filter has limited applications; the vibration mode of resonators is confined, for example, to the bending-mode vibration of disk resonators. Furthermore, design freedom is limited because the electromechanical filter is constituted essentially of symmetrical circuits. The limited design freedom of the prior art filter will be described below in more detail.

The symmetry of a filter circuit depends on the transmission frequency characteristics of the filter circuit, as well as on the manner of design for realizing such characteristics in the filter circuit. It depends also on whether it is the whole or part of the filter circuit where "symmetry" applies. As for the symmetry depending on the transmission frequency characteristics and on the manner of design, a symmetrical filter circuit is obtained when, for example, the passband Chebyshev characteristic is designed by the operating insertion-loss design technique, while an asymmetrical filter circuit is obtained when the passband Chebyshev characteristic is designed by the voltage insertion-loss design technique.

As for the symmetry of the entire filter circuit, symmetry is obtained for the entire circuit when the passband maximally flat characteristic or the passband Chebyshev characteristic is designed by the operating insertion-loss design technique. While, when other characteristics such as flat delay characteristic and linear phase characteristic are designed or when the passband Chebyshev characteristic is designed by the voltage insertion-loss design technique, symmetry is not available in the entire filter circuit, and therefore it is impossible to realize these characteristics with the prior art mechanical filter.

The symmetry in part of the filter circuit will be described below. In the case of flat delay characteristic, the entire filter circuit is not symmetrical and hence part of the circuit is not symmetrical. In the case of designing Chebyshev characteristic or the maximally flat characteristic by the operating insertion-loss design technique, the entire filter circuit is symmetrical. Therefore, when this circuit is expressed in terms of a lattice circuit, and calculation is repeated so that the common part of the arm impedance is extracted outside, then a symmetrical lattice circuit can be obtained in the center of the filter circuit. As a result, all the finite-attenuation poles are concentrated in the center lattice circuit. Therefore, when the number of finite-attenuation poles is large, the insertion-loss becomes inevitably high in the center lattice circuit, with the result that the sensitivity of the elements in the attenuation region becomes high and the productivity of the electromechanical filter is lowered.

SUMMARY OF THE INVENTION

An object of the invention is to provide an electromechanical filter in which a prototype circuit of asymmetrical filter is constituted of a mechanical vibration system without sacrificing design freedom.

With this and other objects in view, the invention provides an electromechanical filter comprising: a first resonator disposed on the input side; a second resonator diposed on the output side; an input coupling means and an output coupling means for coupling said first resonator to an input-side circuit and said second resonator to an output-side circuit, respectively, through electromechanical energy conversion means when necessary; and a plurality of third resonators, at least two in number, disposed between said first and second resonators; wherein said third resonators are coupled mechanically in parallel to said first and second resonators by a plurality of input-side and output-side coupler pairs so that one of said first and second resonators is in a reverse phase relationship with a predetermined one of said third resonators, and wherein more than five percent difference in coupling coefficient is given between at least one of said input-side and output-side coupler pairs.

Because the electromechanical filter of the invention is of asymmetrical type, finite-attenuation poles can be formed in the transmission frequency characteristic without any limitation to the manner of design. Furthermore, such characteristics as flat delay characteristics and linear phase characteristic can be realized in the electromechanical filter.

According to the invention, a electromechanical filter is constructed by the following steps of transformation from a prototype circuit of an asymmetrical filter with finite-attenuation poles into a parallel ladder circuit:

1. A prototype circuit of asymmetrical filter having attenuation poles is transformed into a circuit lying between two parallel resonant circuits;
2. In the circuit of (1) above, an admittance matrix of the circuit lying between two parallel resonant circuits is set uo, expanded into partial fractions, and then converted to a partial fractions circuit;
3. Transformations such as imaginary gyrator transformation and Norton transformation are applied to the circuit of (2) whereby a parallel ladder circuit is obtained; and
4. The parallel-ladder circuit of (3) is made up of resonators and couplers and converted to a electromechanical filter.

BRIEF DESCRIPTION OF THE DRAWINGS

The invention will be described in more detail by referring to the accompanying drawings wherein.

DESCRIPTION OF THE PREFERRED EMBODIMENTS

Figure 3:
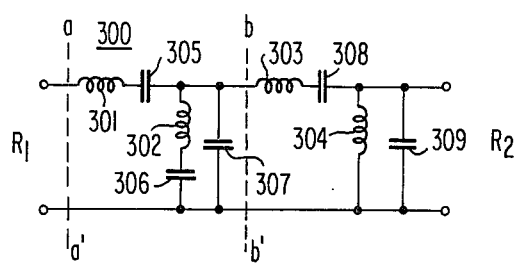
FIG. 3 is a diagram showing a prototype circuit of the electromechanical filter shown in FIG. 1.
Figure 4:
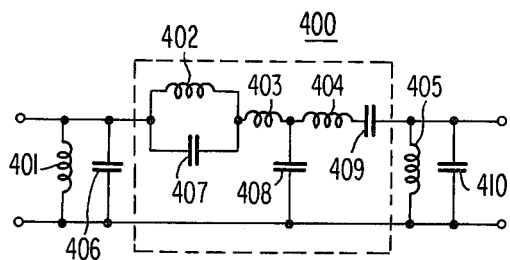
FIGS. 4 and 5 are diagram useful for illustrating steps of transforming the prototype circuit of FIG. 3 into the electrical equivalent circuit of FIG. 2.
Figure 5:
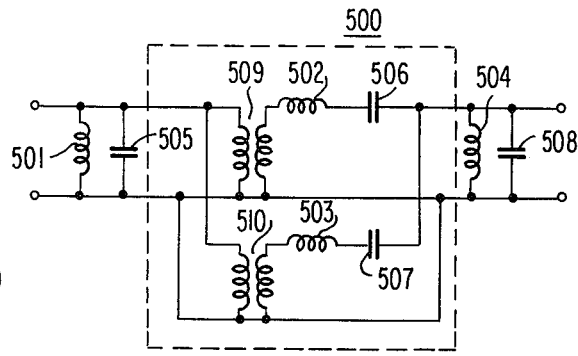

The circuit shown in FIG. 2, which is the equivalent circuit of the electromechanical filter shown in FIG. 1, will be described by referring to FIGS. 3 to 5. FIG. 3 shows a prototype circuit of asymmetrical filter having one finite-attenuation pole on the lower side of the passband. When the circuit lying between segments $aa' - bb'$ is converted according to the foregoing principle (1) of the invention, a circuit lying between parallel resonant circuits as shown in FIG. 4 is obtained. Then a circuit shown in FIG. 5 is obtained through conversion by applying principle (2) of the invention to the circuit encircled with the broken line in FIG. 4. When this circuit is further converted according to principle (3) of the invention, a parallel ladder circuit (i.e., the equivalent circuit of the invention shown in FIG. 2) is obtained.

To give numerical examples for the circuit of FIGS. 2 to 5, it is assumed with the circuit of FIG. 3 first that the center frequency is set at 114KHz and that the bandwidth is 2KHz. Then, the circuit constants for FIG. 3 are as follows:

$R_1$ (input characteristic impedance : 0.86450910 (ohm)
$R_2$ (output characteristic impedance) : 1.0 (ohm)
301: $0.37316960 \times 10^{-4}$ (henry)   305: $0.52578214 \times 10^{-7}$ (farad)
302: $0.35416643 \times 10^{-5}$ (henry)   306: $0.58384782 \times 10^{-6}$ (farad)
303: $4.1503332 \times 10^{-5}$ (henry)    307: $0.10871959 \times 10^{-4}$ (farad)
304: $0.61409460 \times 10^{-7}$ (henry)   308: $4.7074774 \times 10^{-8}$ (farad)
                                            309: $0.31007391 \times 10^{-4}$ (farad)

Circuit 300 lying between lines $a—a'$ and $b—b'$ is converted as mentioned above to a dotted-line-enclosed circuit 400 lying between two parallel resonant circuits shown in FIG. 4. Putting the above figures for the circuit of FIG. 3 into FIG. 4 gives the following numerical examples for the latter:

401: $0.5257\ 8214 \times 10^{-7}$ (henry)   406: $0.3731\ 6960 \times 10^{-4}$ (farad)
402: $0.5838\ 4782 \times 10^{-6}$ (henry)   407: $0.3541\ 6643 \times 10^{-5}$ (farad)
403: $1.226\ 9729 \times 10^{-5}$ (henry)    408: $1.397\ 7696 \times 10^{-6}$ (farad)
404: $4.150\ 3332 \times 10^{-5}$ (henry)    409: $4.871\ 5436 \times 10^{-8}$ (farad)
405: $0.6140\ 9460 \times 10^{-7}$ (henry)   410: $0.3100\ 7391 \times 10^{-4}$ (farad)

The admittance matrix for the circuit 400 is as follows:

$$\begin{bmatrix} Y_{11} & Y_{12} \\ Y_{21} & Y_{22} \end{bmatrix} = \begin{bmatrix} \frac{1}{P}\alpha_0 & \frac{1}{P}\beta_0 \\ \frac{1}{P}\beta_0 & \frac{1}{P}\gamma_0 \end{bmatrix} + \begin{bmatrix} \frac{P\alpha_1}{P^2+Q_1^2} & \frac{P\beta_1}{P^2+Q_1^2} \\ \frac{P\beta_1}{P^2+Q_1^2} & \frac{P\gamma_1}{P^2+Q_1^2} \end{bmatrix} + \begin{bmatrix} \frac{P\alpha_2}{P^2+Q_2^2} & \frac{P\beta_2}{P^2+Q_2^2} \\ \frac{P\beta_2}{P^2+Q_2^2} & \frac{P\gamma_2}{P^2+Q_2^2} \end{bmatrix}$$

Where the figures for $\alpha_0$ through $\alpha_2$, $\beta_0$ through $\beta_2$ $\gamma_0$ through $\gamma_2$, $Q_1$ and $Q_2$ corresponding to the above numerical examples are as follows:

$\alpha_0 = 9.1979743 \times 10^4$    $\beta_0 = 0$                      $\gamma_0 = 0$
$\alpha_1 = 3.1998778 \times 10^3$    $\beta_1 = -7.0717729 \times 10^3$  $\gamma_1 = 1.5628713 \times 10^4$
$\alpha_2 = 1.8654989 \times 10^3$    $\beta_2 = 3.9740187 \times 10^3$   $\gamma_2 = 8.4657377 \times 10^3$
$Q_1 = 7.2077343 \times 10^5$
$Q_2 = 7.0966718 \times 10^5$ Conversion of the above admittance matrix to a partial fractional circuit leads to the circuit of FIG. 5, where the corresponding numerical figures are given as follows:

501:   0.52578214 × 10⁻⁷ (henry)
502:   6.3984793 × 10⁻⁷ (henry)
503:   1.1812320 × 10⁻⁴ (henry)
504:   0.61909460 × 10⁻⁷ (henry)
509:   1: −4.524 859 × 10⁻¹
510:   1: 4.6942378 × 10⁻¹

505:   3.7137253 × 10⁻⁵ (farad)
506:   3.0083320 × 10⁻⁸ (farad)
507:   1.6809519 × 10⁻⁸ (farad)
508:   0.31007391 × 10⁻⁴ (farad)

- 501: $0.52578214 \times 10^{-7}$ (henry)
- 502: $6.3984793 \times 10^{-7}$ (henry)
- 503: $1.1812320 \times 10^{-4}$ (henry)
- 504: $0.61909460 \times 10^{-7}$ (henry)
- 509: $1: -4.524859 \times 10^{-1}$
- 510: $1: 4.6942378 \times 10^{-1}$
- 505: $3.7137253 \times 10^{-5}$ (farad)
- 506: $3.0083320 \times 10^{-8}$ (farad)
- 507: $1.6809519 \times 10^{-8}$ (farad)
- 508: $0.31007391 \times 10^{-4}$ (farad)

Figure 2:
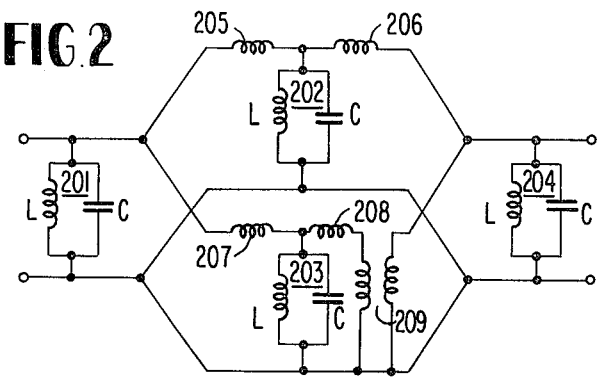
FIG. 2 is a diagram showing an electrical equivalent circuit of the electromechanical filter shown in FIG. 1.

The above-mentioned conversion of the dotted-line-enclosed circuit 500 of FIG. 5 by the imaginary gyrator transformation leads to a parallel ladder circuit as shown in FIG. 2, where the corresponding figures are as follows:

- 201L: $5.241749045 \times 10^{-8}$ (henry)
- 201C: $3.713725342 \times 10^{-4}$ (farad)
- 202L: $5.278864856 \times 10^{-8}$ (henry)
- 202C: $3.713725348 \times 10^{-5}$ (farad)
- 203L: $5.532188528 \times 10^{-8}$ (henry)
- 203C: $3.713725342 \times 10^{-5}$ (farad)
- 204L: $5.414814624 \times 10^{-8}$ (henry)
- 204C: $3.7137253 \times 10^{-5}$ (farad)
- 206: $5.301476261 \times 10^{-6}$ (henry)
- 205: $4.054749395 \times 10^{-6}$ (henry)
- 207: $5.310473142 \times 10^{-6}$ (henry)
- 208: $5.944609071 \times 10^{-6}$ (henry)
- 209: $1: -1$ In FIG. 2, parallel resonant circuits 201 (having a coil 201L and a capacitor 201C) and 204 (204L, 204C), and 202 (202L, 202C) and 203 (203L, 203C) may be replaced with transducers and resonators respectively, and coils 205 through 208 may also be replaced with couplers. A transformer of 1:−1 ratio indicates coupling, in reverse phase, between parallel resonant circuits 202 and 204.

Figure 1:
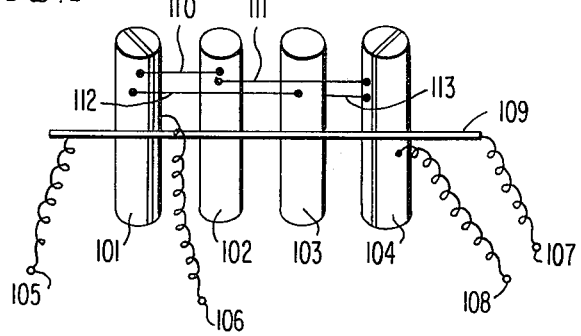
FIG. 1 is a perspective view showing an electromechanical filter of the invention constituted of torsional vibration mode resonators and longitudinal vibration mode couplers.

When the equivalent circuit (FIG. 2) thus obtained is replaced with a mechanical vibration system, an electromechanical filter as shown in FIG. 1 is realized.

FIG. 1 schematically illustrates an asymmetrical pole type electromechanical filter of the invention having one finite-attenuation pole on the lower side of the passband. In FIG. 1, two torsional mode resonators 102 and 103 are linked mechanically in parallel between transducers 101 and 104 by couplers 110 to 113. The transducers 101 and 104, and the resonators 102 and 103 are supported by a supporting wire 109 at their nodal points. The transducers 101 and 104 are equipped with electrical terminals 105 and 106, and 107 and 108. There is a difference of more than five percent in absolute value between the coefficients of coupling between the couplers 110 and 111 which link the resonator 102, or between the coefficients of coupling between the couplers 112 and 113 which link the resonator 103. The more-than-5-percent difference in coupling coefficients may be given to both the coupler pairs 110–111 and 112–113. In order to establish reverse phase coupling between the resonators 103 and 104, the coupler 113 is installed, for example, in contact with the inside of the resonator 103.

Assume the terminals 105 and 106 as input terminals, and 107 and 108 as output terminals. Then, by exciting this circuit, a pole type electromechanical filter having one finite-attenuation pole on the lower side of the passband is obtained. In this mechanical filter, there is a relationship $f_3 < f_2$ (where $f_2$ and $f_3$ are resonant frequencies of resonators 102 and 103). (If the coupling coeffecient of couplers 110 and 112 are equal to those of couplers 111 and 113, respectively, the symmetrical lattice circuit is transformed into a symmetricak parallel tee ladder circuit, which is not desirable in the present filter).

Figure 6:
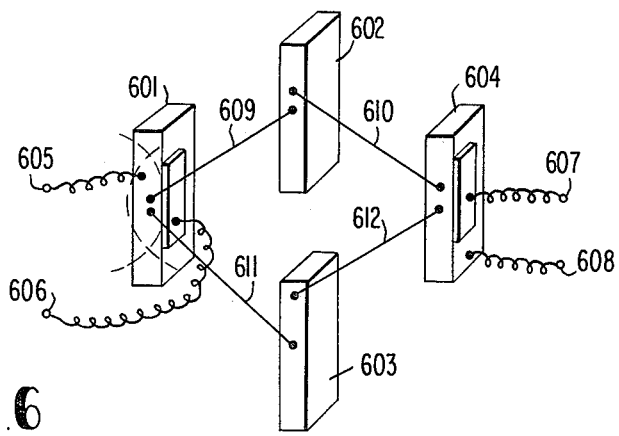
FIG. 6 is a perspective view showing an arrangement wherein the electrical equivalent circuit shown in FIG. 2 is constituted of resonators of fundamental bending-mode.

FIG. 6 schematically illustrates an electromechanical filter wherein the equivalent circuit shown in FIG. 2 is constituted of fundamental bending-mode resonators, not of torsional vibration mode resonators. In FIG. 6, fundamental bending-mode resonators 602 and 603 are linked mechanically in parallel by couplers 609 and 612 between transducers 601 and 604 of fundamental bending-mode. The coupler 612 is to establish reverse phase coupling between the resonators 603 and 604.

As in the embodiment shown in FIG. 1, the coupling coefficients differ by more than 5 percent in absolute value between the couplers 609 and 610, and 611 and 612. The more-than-5-percent difference in coupling coefficient may be given only to one of the coupler pairs 609–610 and 611–612.

The foregoing mechanical filters are of the type using four resonators. On the basis of this arrangement, a variety of parallel ladder type electromechanical filters may be constructed, an example of which is shown in FIG. 7.

Figure 7:
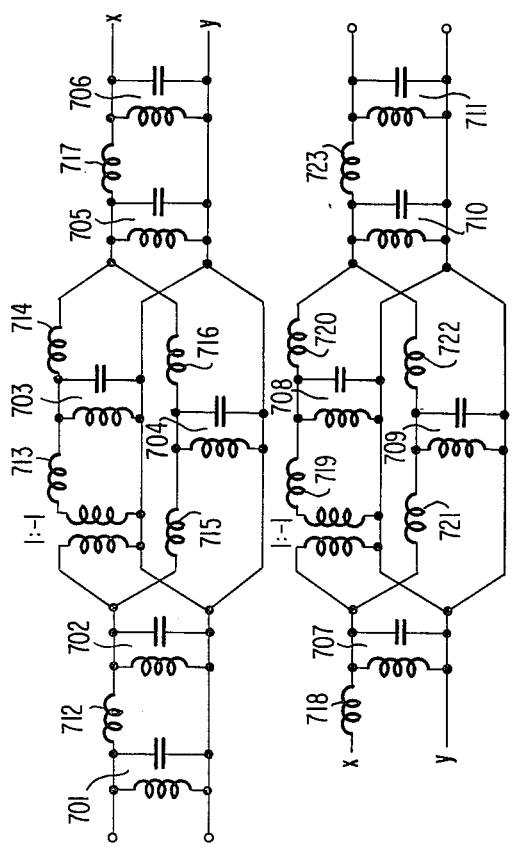
FIG. 7 is a diagram showing an electrical equivalent circuit of asymmetrical 22-nd filter network with two finite-attenuation poles.

FIG. 7 is a diagram showing an electrical equivalent circuit derived from the 22-nd order filter network with two finite-attenuation poles according to the principles of the invention. In this circuit, parallel resonant circuits 701 and 711, and 702 and 710 may be replaced with transducers and resonators respectively, and coils 711 to 723 with couplers. Two 1:−1 ratio transformers show reverse phase relationship between the resonant circuits 702 and 703, and between the resonant circuits 707 and 708, respectively.

Figure 8:
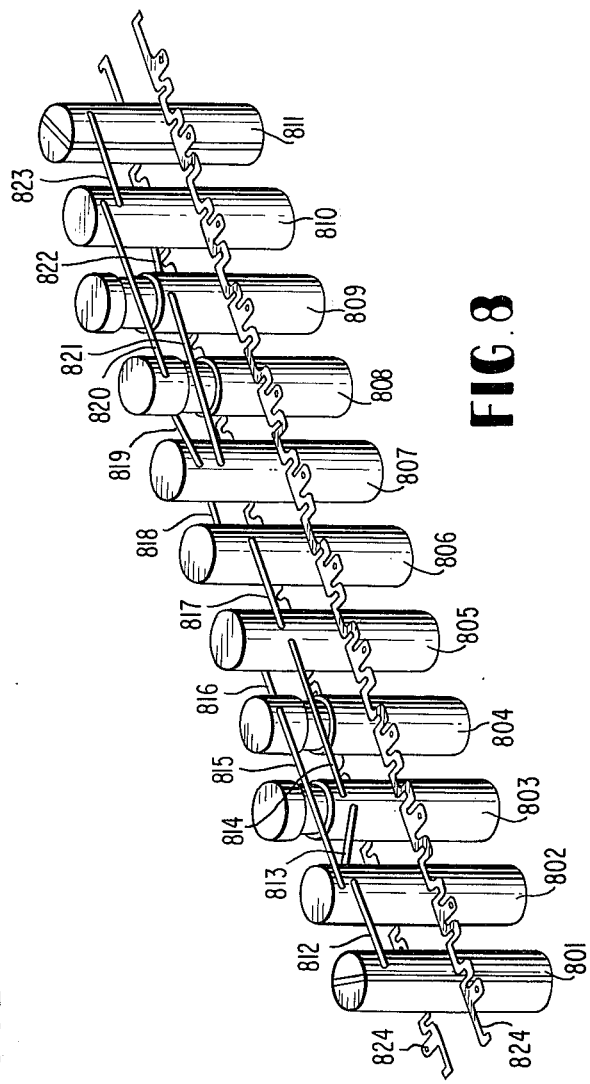
FIG. 8 is a perspective view showing an electromechanical filter wherein the electrical equivalent circuit of FIG. 7 is constituted of torsional mode resonators.

As in the example shown in FIG. 1, when this equivalent circuit is replaced with a mechanical vibration system, an electromechanical filter shown in FIG. 8 is obtained. In FIG. 8, resonators 803 and 804, and 808 and 809 are linked mechanically in parallel between resonators 802 and 805 and between resonators 808 and 809, respectively, by couplers 813 and 820. In this embodiment, like the one shown in FIG. 1, there is provided a coupling coefficient difference by more than five percent in absolute value between the couplers 813 and 814. The more-than-5-percent difference in coupling coefficient may be given also between couplers 815 and 816. Likewise, similar coupling coefficient difference may be given for one or both of the coupler pairs 819–820 and 821–822. The resonators are aligned for the ease of support by a supporting wire 824 at central nodal points of torsional vibration.

Figure 9:
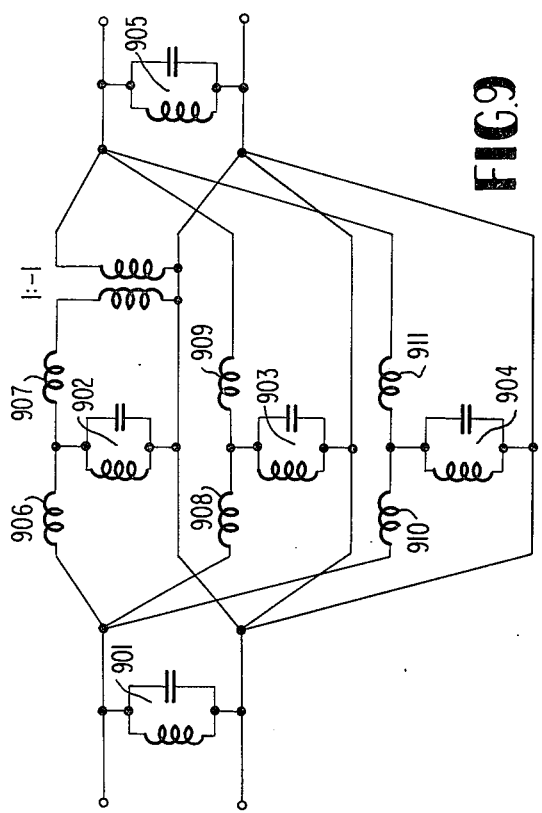
FIG. 9 is a diagram showing an electrical equivalent circuit of a filter network with two finite-attenuation poles wherein three resonant circuits are coupled in parallel to each other.
Figure 10:
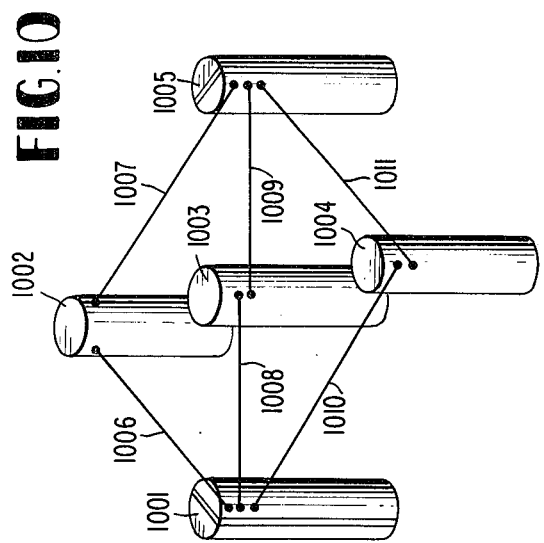
FIG. 10 is a perspective view showing an electromechanical filter wherein the electrical equivalent circuit shown in FIG. 9 is constituted of torsional mode resonators.

FIG. 9 shows another embodiment of the invention wherein a prototype circuit of asymmetrical filter having two finite-attenuation poles, each in upper and lower side of the passband, is transformed into an electrical equivalent circuit. In FIG. 9, parallel resonant circuits 901 and 905, and 902 to 904 may be replaced with transducers and resonators respectively, and coils 906 to 911 with couplers. A 1:−1 ratio transformer stands for a reverse phase relationship between the resonant circuits 902 and 905. Similar to the foregoing embodiments, an electromechanical filter shown in FIG. 10 is obtained when the equivalent circuit is replaced with a mechanical vibration system. This embodiment is characterized in particular by the use of three resonators linked in parallel. In FIG. 10, three resonators 1002, 1003 and 1004 are connected mechanically in parallel between transducers 1001 and 1005 by couplers 1006 to 1011. The coupler 1007 is for establishing a reverse phase relationship between the resonators 1002 and 1005. As in the foregoing examples, more than five percent difference in coupling coefficient is given between at least one of input-side and output-side coupler pairs 1006–1007, 1008–1009, and 1010–1011. In this case, in place of the resonator 1005 described above, the resonators 1001 and 1002 may be connected directly by another coupler.

In the foregoing embodiments, two or three resonators are mechanically linked in parallel to each other. Instead, four or more resonators may be used in the same manner. Also, according to the invention, the torsional vibration mode resonators used in the embodiments as in FIGS. 8 and 10 may be replaced with fundamental being-mode or shear mode vibration resonators.

What is claimed is:

1. An electromechanical filter comprising:
    a. a first resonator disposed on the input side of the filter;
    b. a second resonator disposed on the output side of the filter;
    c. an input coupling means and an output coupling means for coupling said first resonator to an input-side circuit and said second resonator to an output-side circuit, respectively; and
    d. a plurality of third resonators, at least two in number, disposed between said first and second resonators, wherein said third resonators are coupled mechanically in parallel with respect to each other and each of said third resonators are mechanically coupled to said first and second resonators by a plurality of input-side and output-side coupler pairs so that one of said first and second resonators is in a reverse phase relationship with a predetermined one of said third resonators, and wherein more than five percent difference in coupling coefficient is given between at least one of said input-side and output-side coupler pairs.

2. An electromechanical filter as claimed in claim 1 wherein said first resonator and said input side coupling means, and said second resonator and said output-side coupling means are constituted, respectively, of first and second transducers of torsional vibration mode, and two resonators of torsional vibration mode are used as said third resonators.

3. An electromechanical filter as claimed in claim 2 wherein said transducers and said resonators are of elongated cylindrical structure similar in shape to each other, and said reverse phase relationship is established by couplers connected to predetermined ones of said transducers and said resonators at positions symmetrical with each other with respect to the center of a cross-sectional circle of said predetermined ones of said transducers and resonators.

4. An electromechanical filter as claimed in claim 1 wherein said first resonator and said input-side coupling means, and said second resonator and said output-side coupling means are constituted respectively of first and second transducers of torsional vibration mode, and three resonators of torsional vibration mode are used as said third resonators.

5. An electromechanical filter as claimed in claim 4 wherein said transducers and said resonators are of elongated cylindrical structure similar in shape to each other, and said reverse phase relationship is established by couplers connected to predetermined ones of said transducers and said resonators at positions symmetrical with each other with respect to the center of a cross-sectional circle of said predetermined one of said transducers and resonators.

6. An electromechanical filter as claimed in claim 1 wherein said first resonator and said input-side coupling means, and said second resonator and said output-side coupling means are constituted respectively of first and second transducers of first-order bending vibration mode, and two resonators of first-order bending vibration mode are used as said third resonators.

7. An electromechanical filter as claimed in claim 6 wherein said transducers and said resonators are rectangular in cross-section and of elongated square bar structure similar in shape to each other, and said reverse phase relationship is established by couplers connected to predetermined ones of said transducers and said resonators at about the center of and at an end of the side face on one of the shorter arms of the rectangular cross-section of said predetermined ones of said transducers and third resonators.

* * * * *